(12) United States Patent
Chen et al.

(10) Patent No.: US 7,411,536 B1
(45) Date of Patent: Aug. 12, 2008

(54) DIGITAL-TO-ANALOG CONVERTER

(75) Inventors: Ping-Po Chen, Sinshih Township (TW); Guo-Ying Hsu, Sinshih Township (TW)

(73) Assignee: Himax Technologies Limited, Sinshih Township (TW)

( * ) Notice: Subject to any disclaimer, the term of this patent is extended or adjusted under 35 U.S.C. 154(b) by 0 days.

(21) Appl. No.: 11/692,327

(22) Filed: Mar. 28, 2007

(51) Int. Cl.
*H03M 1/66* (2006.01)
(52) U.S. Cl. ...................... 341/144; 341/145
(58) Field of Classification Search ........... 341/144, 341/145; 345/204, 87, 96
See application file for complete search history.

(56) References Cited

U.S. PATENT DOCUMENTS 6,577,293 B1 * 6/2003 Kwon .................... 345/89
7,133,035 B2 * 11/2006 Kim et al. ............... 345/204
7,180,497 B2 * 2/2007 Lee et al. ................ 345/98
7,205,972 B1 * 4/2007 Kyeong et al. ........... 345/98

* cited by examiner

*Primary Examiner*—Brian Young

(57) ABSTRACT

A digital-to-analog converter and method for transforming a digital value into an analog signal are disclosed. The digital-to-analog converter has a voltage generator, a voltage selector, a multiplexer and a switch array. The voltage generator provides a first and second group of voltages. The voltage selector selectively outputs the first or second group of voltages according to a polarity signal. The multiplexer selectively outputs the digital value or a complementary value of the digital value according to the polarity signal. The switch array outputs one of the voltages received from the voltage selector according to the value output from the multiplexer.

9 Claims, 6 Drawing Sheets

DIGITAL-TO-ANALOG CONVERTER

BACKGROUND

1. Field of Invention

The present invention relates to a source driver. More particularly, the present invention relates to a digital-to-analog converter of a source driver.

2. Description of Related Art

FIG. 1 shows a function block of a digital-to-analog converter (DAC) of a LCD source driver. Output voltage Vout is selected with a switch array 108 from gamma voltages $Vr^0 \sim Vr_{2-1}{}^n$ from a corresponding decoder input which is controlled by digital codes $A_0 \sim An_{-1}$. Here, $A_{n-1}$ is chosen as Most Significant Bit (MSB) and $A_0$ is chosen as Least Significant Bit (LSB).

For a conventional line-inversion LCD, the switch array 108 as illustrated in FIG. 2 requires two full sets of columns 118 and 128, which have different transistor types for the two groups of gamma voltages provided in response to different polarities while the line-inversion LCD displaying, respectively, one set of the columns 118 having P-type Metal-Oxide-Semiconductor (PMOS) transistors and the other set of the columns 128 having N-type Metal-Oxide-Semiconductor (NMOS) transistors, and therefore this architecture occupies large area of the source driver chip.

SUMMARY

According to one embodiment of the present invention, a digital-to-analog converter for transforming a digital value into an analog signal is disclosed. The digital-to-analog converter comprises a voltage generator, a voltage selector, a multiplexer and a switch array. The voltage generator provides a first and second group of voltages. The voltage selector selectively outputs the first or second group of voltages according to a polarity signal. The multiplexer selectively outputs the digital value or a complementary value thereof according to the polarity signal. The switch array outputs one of the voltages received from the voltage selector according to the value output from the multiplexer.

According to another embodiment of the present invention, a method for transforming a digital value into an analog signal is disclosed. A first and second group of voltages are provided. The first or second group of voltages is selected according to a polarity signal, and the digital value or a complementary value thereof is selected according to the polarity signal. One of the voltages in the selected group is then output according to the selected value.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
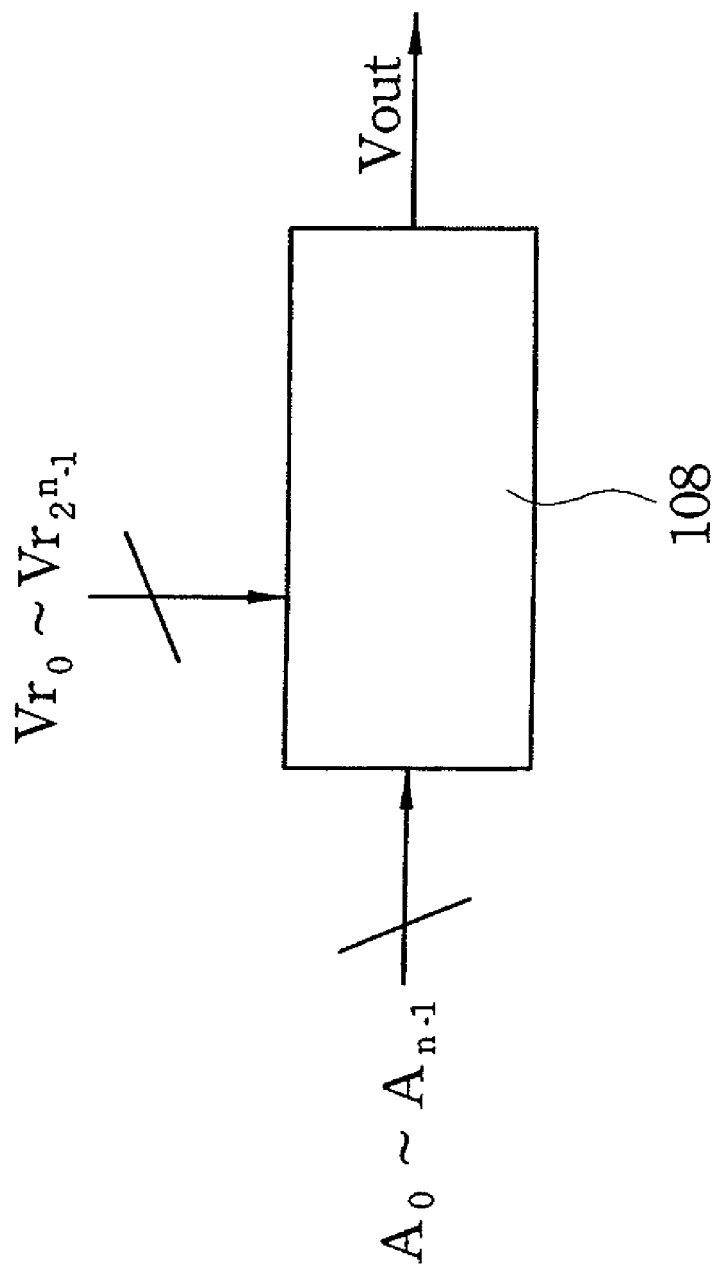
FIG. 1 shows a function block of a conventional DAC of a LCD source driver.
Figure 2:
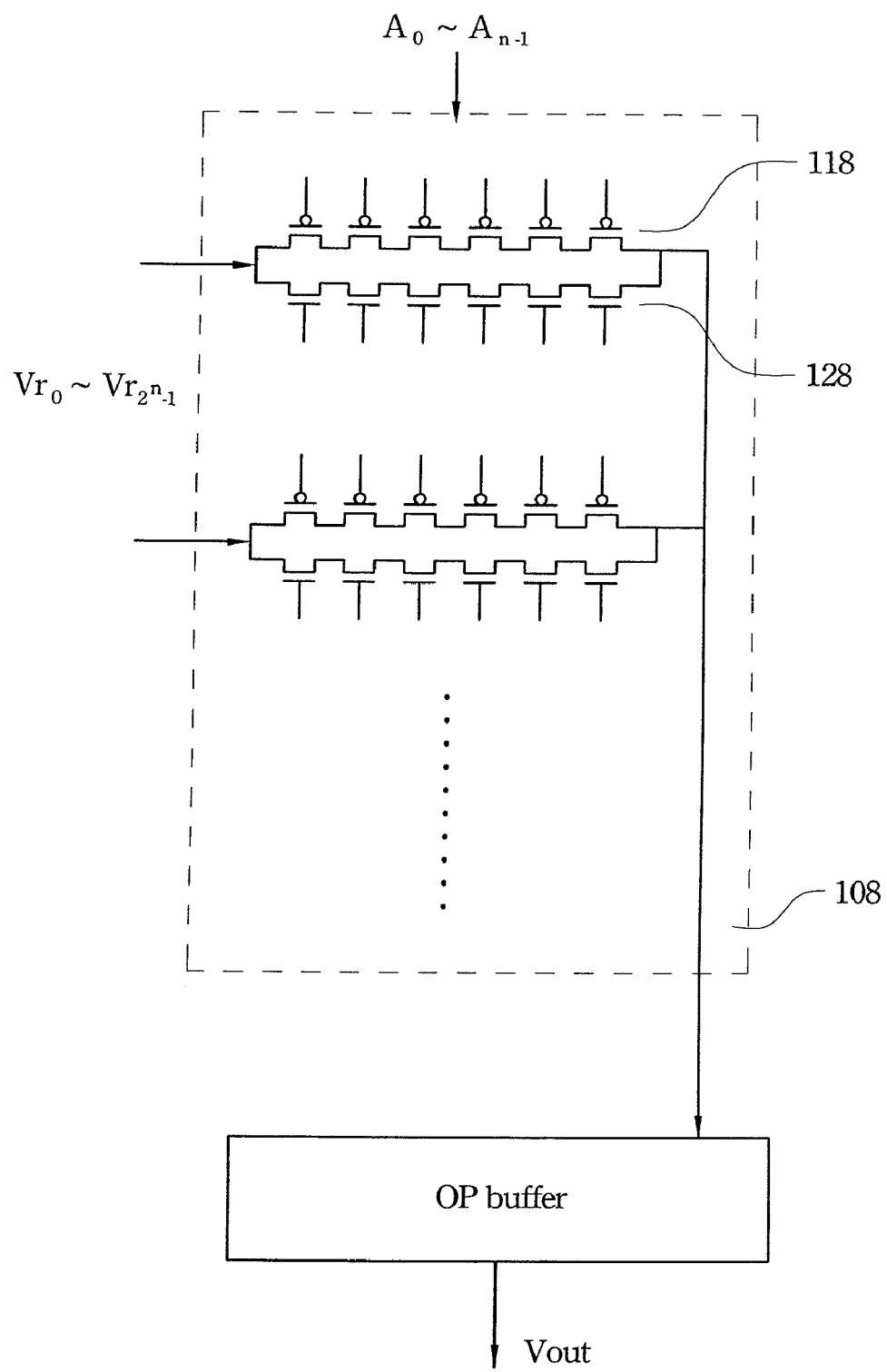
FIG. 2 shows a conventional switch array of the DAC in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
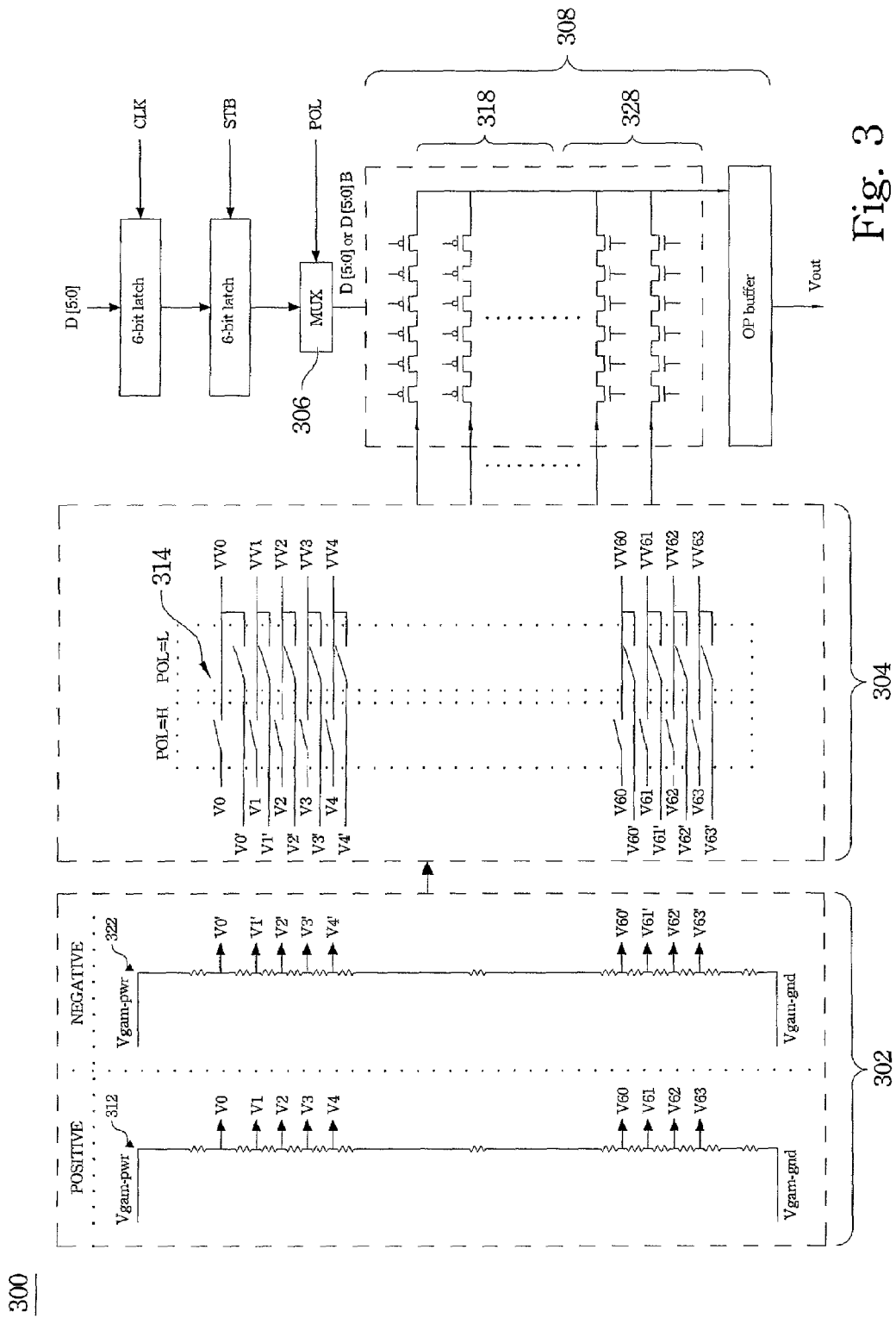
FIG. 3 is a digital-to-analog converter according to one embodiment of the present invention.

FIG. 3 is a digital-to-analog converter according to one embodiment of the present invention. The digital-to-analog converter 300 transforms a 6-bit digital value D[5:0] into an analog signal Vout. The digital-to-analog converter 300 has a voltage generator 302, a voltage selector 304, a multiplexer 306 and a switch array 308.

The voltage generator 302 provides a first group of voltages V0~V63 and a second group of voltages V0'~V63'. The voltage selector 304 selectively outputs the first group of voltages V0~V63 or the second group of voltages V0'~V63' according to a polarity signal POL. The multiplexer (MUX) 306 selectively outputs a 6-bit digital value D[5:0] or a complementary value thereof D[5:0]B according to the polarity signal POL. The switch array 308 outputs one of the voltages VV0~VV63 received from the voltage selector 304 according to the value output from the multiplexer 306.

When the digital-to-analog converter 300 is used, for example, in a source driver of a line-inversion LCD, the digital value D[5:0] can be a pixel value, and the voltages in the first and second group V0~V63 and V0'~V63' are gamma voltages.

The switch array 308 has a first switch array portion 318 and a second switch array portion 328. The first switch array portion 318 has PMOS transistor columns, and each column receives one of the higher half of the voltages VV0~VV63 output from the voltage selector 304. The second switch array portion 328 has NMOS transistor columns, and each column receives one of the lower half of the voltages VV0~VV63 output from the voltage selector 304. That is, the voltages VV0~VV31 with higher voltage levels are input into the first switch array portion 318 of the PMOS transistors, and the voltages VV32~VV63 with lower voltage levels are input into the second switch portion 328 of the NMOS transistors.

Moreover, the PMOS transistors in the same column are connected in series, and the NMOS transistors in the same column are connected in series. The gates of the PMOS transistors and NMOS transistors in the same row are all coupled to receive one of the bits with the value D[5:0] or D[5:0]B output from the multiplexer 306.

In this embodiment, the voltage generator 302 has a first string 312 of resistors R0~R63 (R-string) to provide the first group of voltages V0~V63 and a second string 322 of resistors R0'~R63' to provide the second group of voltages V0'~V63'.

More particularly, each of the voltages in the first group V0~V63 is a counterpart of one of the voltages in the second group V0'~V63', and each of the voltages in the first group and its counterpart in the second group correspond to the same gray level. For example, the voltage V0 in the first group is a counterpart of the voltage V0' in the second group, and both voltages V0 and V0' correspond to the same gray level under different polarities indicated by the polarity signal POL.

The voltage selector 304 has switches 314 to selectively output the voltages V0~V63 or V0'~V63'. Each of the switches 314 couples one of the voltages in the first group V0~V63 or the counterpart thereof in the second group V0'~V63' to one of the outputs of the voltage selector 304 according to the polarity signal POL. For example, when the polarity signal POL indicates the polarity is high (H), the switches 314 couples the voltages of the first group V0~V63 to the outputs of the voltage selector 304; when the polarity signal POL indicates the polarity is low (L), the switches 314 couples the voltages of the second group V0'~V63' to the outputs of the voltage selector 304.

Figure 4:
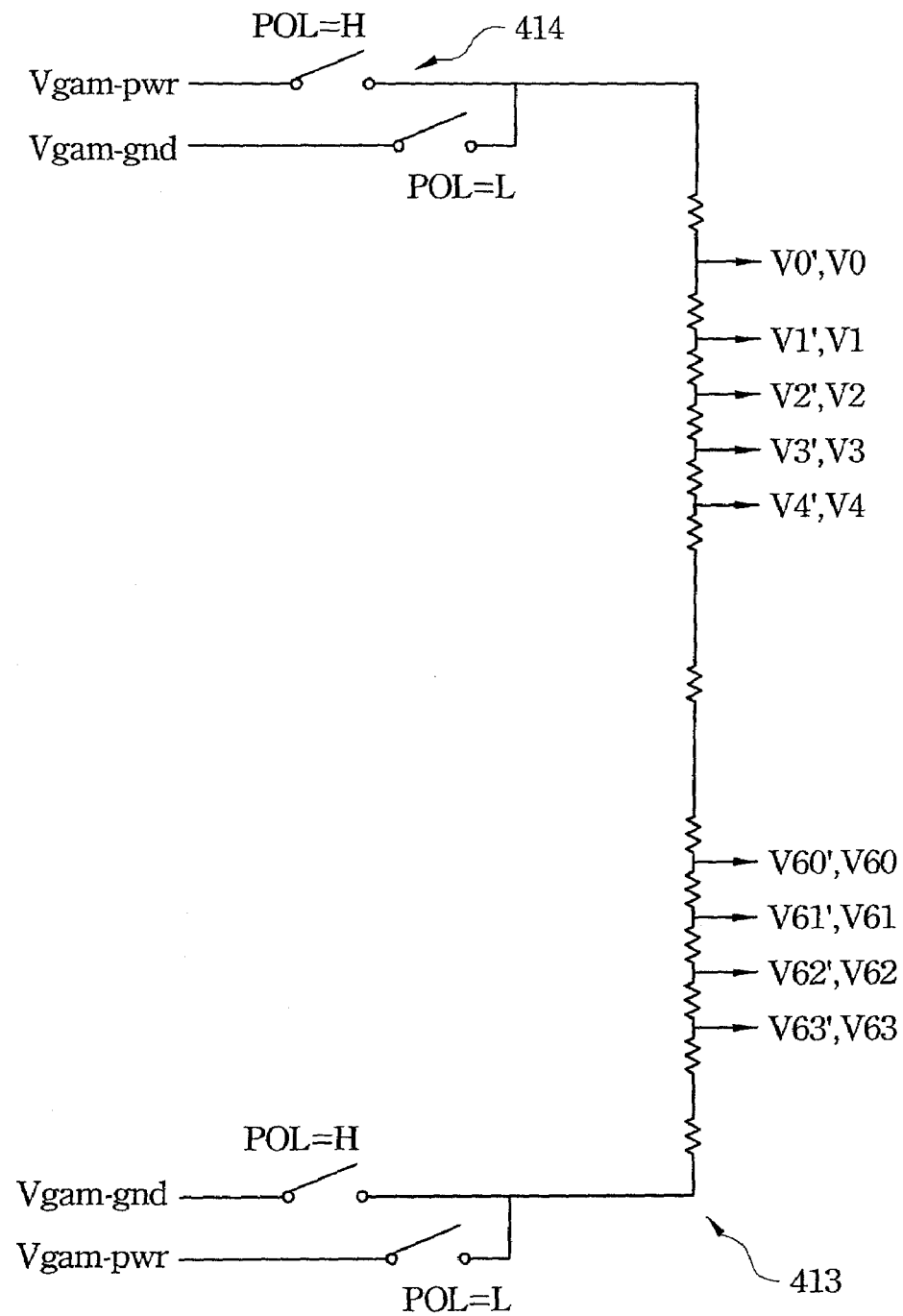
FIG. 4 is an alternative circuit for implementing the voltage generator and voltage selector according to another embodiment of the present invention.

If the voltages of the first and second groups V0~V63 and V0'~V63' are properly symmetrical under different polarities, another embodiment of the present invention provides an alternative circuit 403 to implement the voltage generator and voltage selector, as illustrated in FIG. 4. In the alternative circuit 403, one string 413 of resistors R0~R63 is used to selectively provide the first group of voltages V0~V63 or the second group of voltages V0'~V63' from the switches 414, which couple different reference voltages to the string 413 of resistors R0~R63 according to the polarity signal POL.

Figure 5:
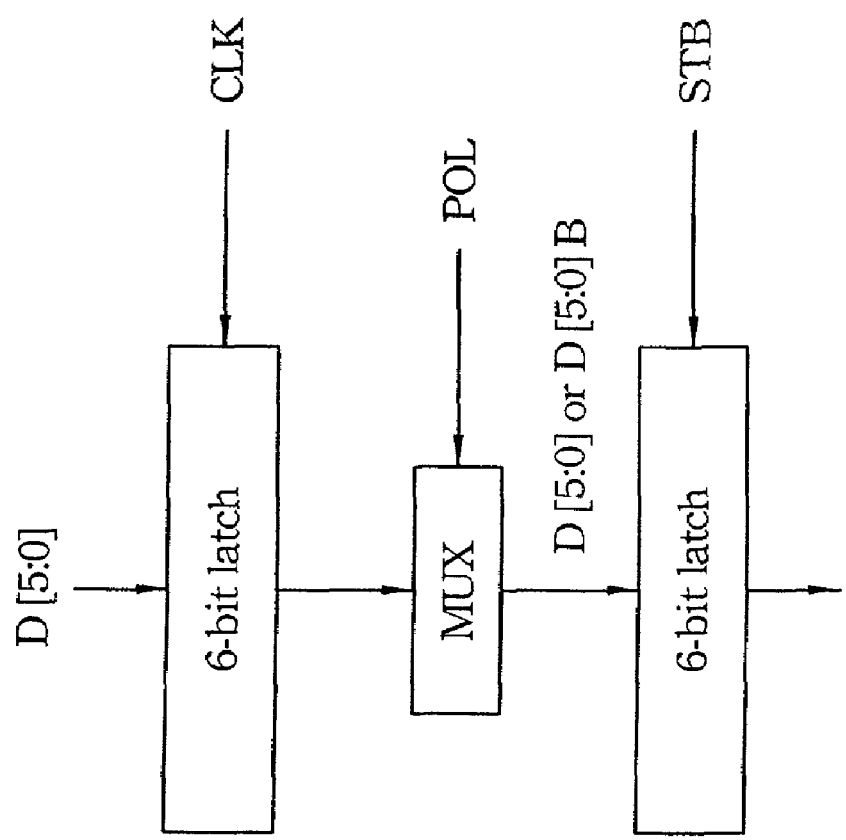
FIG. 5 shows the latches and multiplexer according to another embodiment of the present invention.

In addition, referring to FIG. 3, the digital-to-analog converter 300 further has two latches to transfer the 6-bit digital value D[5:0] to the multiplexer 306. One latch is controlled by a clock signal CLK, and the other latch is controlled by a strobe signal STB. According to another embodiment of the present invention, as illustrated in FIG. 5, the digital-to-analog converter can have one latch controlled by the clock signal CLK, transferring the digital value D[5:0] to the multiplexer 306, and another latch controlled by the strobe signal STB, transferring the value D[5:0] or D[5:0]B output from the multiplexer 306 to the switch array 308.

Figure 6:
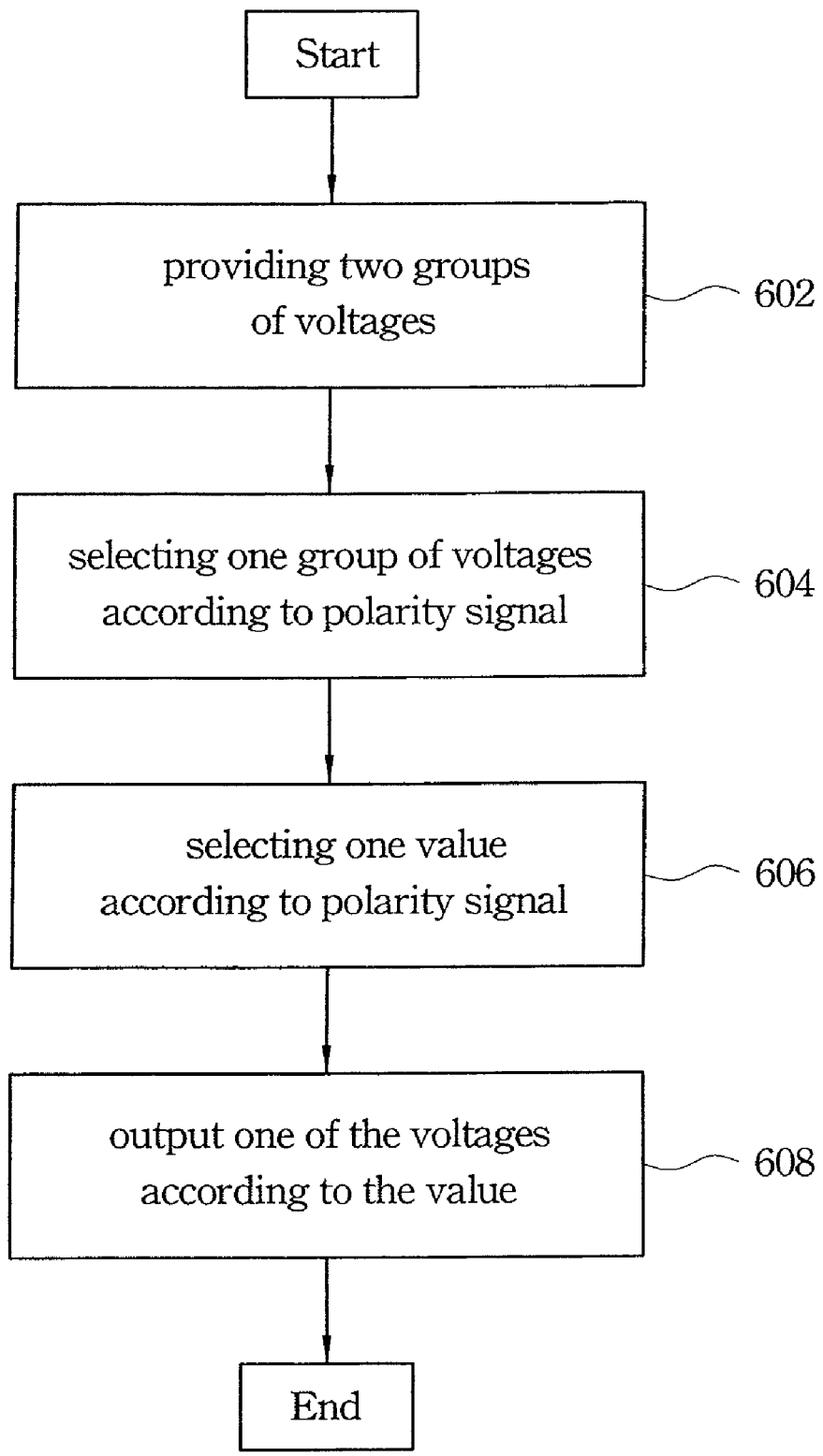
FIG. 6 is a flow chart of the method according to another embodiment of the present invention.

In another aspect, a method for transforming a digital value into an analog signal is also disclosed. FIG. 6 is a flow chart of the method according to another embodiment of the present invention. The following descriptions are made with reference to FIG. 3 and FIG. 6.

Firstly, a first group of voltages V0~V63 and a second group of voltages V0'~V63' are provided (step 602). The first or second group of voltages V0~V63 or V0'~V63' is selected according to a polarity signal POL (step 604), and the digital value D[5:0] or a complementary value thereof D[5:0]B is selected according to the polarity signal POL (step 606). One of the voltages in the selected group is then output according to the selected value (step 608).

When the digital-to-analog converter 300 is used, for example, in a source driver of a line-inversion LCD, the digital value D[5:0] can be a pixel value, and the voltages in the first and second group V0~V63 and V0'~V63' are gamma voltages.

More particularly, each of the voltages in the first group V0~V63 is a counterpart of one of the voltages in the second group V0'~V63', and each of the voltages in the first group and its counterpart in the second group correspond to a same gray level. For example, the voltage V0 in the first group is a counterpart of the voltages V0' in the second group, and both of the two voltages V0 and V0' correspond to the same gray level under different polarities indicated by the polarity signal POL.

The embodiments of the present invention modulates the digital value and the gamma voltages in response to different polarities while the LCD displaying, for example, by selecting the corresponding group of voltages and using a multiplexer to obtain the selected value according to the polarity signal of the LCD, and therefore the required columns of transistors in the switch array are decreased and thus the occupied area thereof in the source driver chip is also reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A digital-to-analog converter for transforming a digital value into an analog signal, comprising:
    a voltage generator providing a first and second group of voltages, wherein each of the voltages in the first group is a counterpart of one of the voltages in the second group, and each of the voltages in the first group and its counterpart in the second group correspond to the same gray level;
    a voltage selector selectively outputting the first or second group of voltages according to a polarity signal;
    a multiplexer selectively outputting the digital value or a complementary value thereof according to the polarity signal; and
    a switch array outputting one of the voltages received from the voltage selector according to the value output from the multiplexer.

2. The digital-to-analog converter as claimed in claim 1, wherein the switch array comprises:
    a first switch array portion comprising a plurality of columns of PMOS transistors, wherein each column receives one of a higher half of the voltages output from the voltage selector; and
    a second switch array portion comprising a plurality of columns of NMOS transistors, wherein each column receives one of a lower half of the voltages output from the voltage selector.

3. The digital-to-analog converter as claimed in claim 1, wherein the PMOS transistors in the same column are connected in series, the NMOS transistors in the same column are connected in series, and the gates of the PMOS transistors and NMOS transistors in the same row are all coupled to receive one of bits of the value output from the multiplexer.

4. The digital-to-analog converter as claimed in claim 1, wherein the voltage generator comprises a first string of resistors for providing the first group of voltages and a second string of resistors for providing the second group of voltages.

5. The digital-to-analog converter as claimed in claim 1, wherein the voltage selector comprises a plurality of switches, and each of the switches couples one of the voltages in the first group or the counterpart thereof in the second group to one of outputs of the voltage selector according to the polarity signal.

6. The digital-to-analog converter as claimed in claim 1, further comprising a latch transferring the value output from the multiplexer to the switch array.

7. The digital-to-analog converter as claimed in claim 1, wherein the digital value is a pixel value, and the voltages in the first and second group are gamma voltages.

8. A method for transforming a digital value into an analog signal, comprising the steps of:
    providing a first and second group of voltages wherein each of the voltages in the first group is a counterpart of one of the voltages in the second group, and each of the voltages in the first group and its counterpart in the second group correspond to the same gray level;

selecting the first or second group of voltages according to a polarity signal;
selecting the digital value or a complementary value thereof according to the polarity signal; and
outputting one of the voltages in the selected group according to the selected value.

9. The method as claimed in claim 8, wherein the digital value is a pixel value, and the voltages in the first and second group are gamma voltages.

* * * * *